(12) United States Patent
Centa

(10) Patent No.: US 10,587,237 B2
(45) Date of Patent: Mar. 10, 2020

(54) DEVICE FOR DIGITAL PROCESSING OF ANALOG SOUND EFFECTS

(71) Applicant: Urban Centa, Ljubljana (SI)

(72) Inventor: Urban Centa, Ljubljana (SI)

(73) Assignee: Urban Centa (SI)

( * ) Notice: Subject to any disclaimer, the term of this patent is extended or adjusted under 35 U.S.C. 154(b) by 0 days.

(21) Appl. No.: 15/779,539

(22) PCT Filed: Nov. 3, 2016

(86) PCT No.: PCT/SI2016/000025
§ 371 (c)(1),
(2) Date: May 28, 2018

(87) PCT Pub. No.: WO2017/091157
PCT Pub. Date: Jun. 1, 2017

(65) Prior Publication Data
US 2018/0351522 A1 Dec. 6, 2018

(30) Foreign Application Priority Data

Nov. 26, 2015 (SI) .................................. P-201500285

(51) Int. Cl.
*G10H 1/00* (2006.01)
*H03G 3/00* (2006.01)
*H03G 3/02* (2006.01)

(52) U.S. Cl.
CPC ........... *H03G 3/001* (2013.01); *G10H 1/0091* (2013.01); *H03G 3/02* (2013.01);
(Continued)

(58) Field of Classification Search
CPC ............... G10H 1/0083; G10H 1/0025; G10H 2210/155; G10H 2240/305;
(Continued)

(56) References Cited

U.S. PATENT DOCUMENTS 5,866,834 A * 2/1999 Burke ...................... G10H 1/46
84/622

FOREIGN PATENT DOCUMENTS

WO WO-2008125582 A1 * 10/2008 ........... G10H 1/0091

* cited by examiner

*Primary Examiner* — George C Monikang
(74) *Attorney, Agent, or Firm* — The Watson IP Group, PLC; Jovan N. Jovanovic

(57) ABSTRACT

The object of the invention is a device for digital control of analogue sound processing, the purpose of which is an upgrade of a classic analogue sound processing device. The device comprises at least one external regulation element, an analogue effect, at least one digital regulation element, at least one control button, at least one memory location for storing positions of the external regulation elements, and a control circuit with a pre-downloaded software. The device according to the invention digitally controls analogue sound processing, wherein the external appearance of the device and its handling are as similar to the existing known devices as possible and the sound processing is identical, analogue, as with the existing devices. It has additional options enabled: a) the device may be set from pre-set memory locations that contain combinations of positions of the regulation elements which determine sound alteration; b) storage of combinations of positions of the regulation elements into the memory for subsequent use; c) remote control of the device by an external device, for instance by an adequate application downloaded onto a phone, tablet or computer; d) downloading of combinations of positions of the regulation elements to the memory of the device according to the invention by an external device.

8 Claims, 1 Drawing Sheet

(52) U.S. Cl.
CPC ... *G10H 2210/155* (2013.01); *G10H 2220/00* (2013.01); *G10H 2220/155* (2013.01)

(58) Field of Classification Search
CPC .......... G10H 2240/311; G10H 1/0033; G10H 1/0066; G10H 1/0091; G10H 2220/061; G10H 2240/211; G11C 7/16
USPC ............................... 381/118; 84/1, 602, 604
See application file for complete search history.

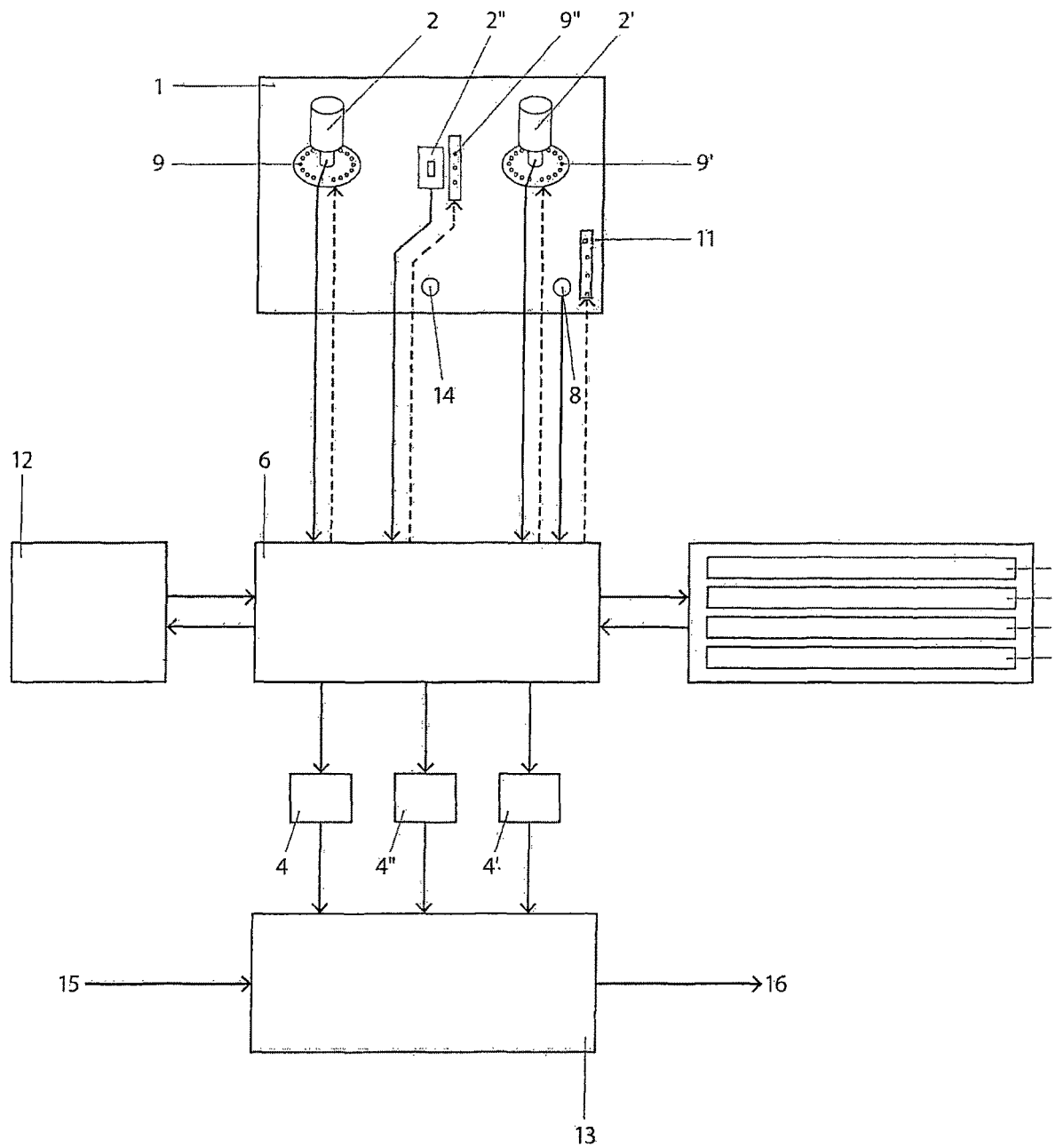

DEVICE FOR DIGITAL PROCESSING OF ANALOG SOUND EFFECTS

The object of the invention is a device for digital control of analogue sound processing, the purpose of which is an upgrade of a classic analogue sound processing device.

Classic analogue sound processing devices such as analogue amplifiers or analogue guitar effects include external regulation elements, with which a user alters the sound and which need to be manually set by the user to adequate positions in order to achieve a desired sound effect. External regulation elements for sound alteration are arranged on a device and may be analogue potentiometers, digital potentiometers or switches. External regulation elements for sound alteration in classic analogue devices are preferably analogue potentiometers or switches. Generally, analogue guitar effects for instance include one to four analogue potentiometers for manual setting of a desired sound effect; however, guitar effects can also include a switch, such as EBS OctaBass, where a switch is used to manually select a desired scope of octaves of a sound effect that was already set in advance by analogue potentiometers. If the user, while playing the guitar, wants to after a sound effect currently set with the selected position of analogue potentiometers and/or a switch, he must manually change positions of the analogue potentiometers and/or the switch. Classic analogue devices only provide for manual alteration of the sound by means of external regulation elements. Moreover, classic analogue devices do not enable storage of position settings of external regulation elements, such that these settings could subsequently be used after the positions of individual external regulation elements have been changed. Classic analogue control is impractical for use. Moreover, the existing devices do not provide for remote control, i. e. remote selection and/or storage of pre-set positions of external regulation elements for instance with an application on an external device such as tablet, smart phone, computer.

There are known devices for digital sound processing, e. g. Line 6 POD X3, where the sound is completely controlled and processed digitally. An advantage of these devices is their ability to store sound settings into memory locations and this is why they are more widely applicable and user friendlier. A disadvantage of these devices lies in the fact that a sound effect is not achieved by analogue means but in a digital way, i. e. these devices mimic sound effects of analogue devices. Sound effects thus get copied and are therefore considered by musicians as being of lower value.

The purpose of the invention is to make a device that will eliminate all indicated disadvantages. The device of the invention digitally controls analogue sound processing in a way that:
- it provides for the fact that the external appearance of the device and its handling are very close to the existing known devices; the users thus have identical user's experience of classic handling with potentiometers and/or switches,
- it provides for identical sound processing, analogue processing, as with the existing devices, because the users are more comfortable with analogue processing compared to digital sound processing,
  - it provides for further options such as a) setting of the device from pre-set memory locations that contain combinations of positions of regulation elements that determine sound alteration; b) storing combinations of positions of regulation elements into a memory for subsequent use; c) remote control of the device by an external device, for instance by an application on the phone, tablet or computer; d) downloading combinations of positions of regulation elements into the memory of the device of the invention by an external device.

The device according to the invention will be described in the continuation and in the FIGURE.

FIG. 1 shows an embodiment of the device according to the invention which is an upgrade of an analogue guitar effect.

The device of the invention comprises:
- at least one external regulation element connected to a control circuit;
- at least one digital regulation element that is part of an external regulation element, wherein the digital regulation element is connected to (a) a control circuit, from which it obtains data as to which position to take, and (b) to an analogue effect, wherein the position of the digital regulation element directly determines a sound effect of the analogue effect; if the device has several external regulation elements, each has its own digital regulation element; digital regulation elements are preferably digital potentiometers and/or digital switches;
- at least one memory location for storing positions of external regulation elements; if there are several external regulation elements and respective digital regulation elements, a combination of all positions of external regulation elements of the device is stored to one memory location; memory locations are connected with the control circuit or can be part of the control circuit;
- a control circuit that controls the device in compliance with the pre-downloaded software and in compliance with user's pushes of the control button, namely: (a) it selects whether a position of digital regulation elements is determined by external regulation elements or with pre-set positions of regulation elements stored in a memory location; (b) if there are several memory locations, the control circuit also selects which memory location determines the positions of digital control elements; and (c) positions of external regulation elements are stored to the selected memory location;
- an analogue effect which is a part of the device which actually processes an input sound signal in an analogue way and is preferably the same as with classic analogue sound processing devices; wherein the analogue effect is controlled by the control circuit through one or several digital regulation elements;
- at least one control button connected with the control circuit, with which the user by pushing (a) stores a combination of positions of external regulation elements to a selected memory location;
- and/or (b) selects among memory locations if there are several of them; there is preferably one control button.

Given the fact that there is a single control button in one of preferred embodiments that performs two functions, namely storage and selection among memory locations, the device according to the invention must be realized in a way that a push for one function is different from a push for the other function. One of the embodiments realizes this requirement in a way that a push shorter than n seconds represents selection of a memory location, namely a shift to a next memory location; while a push longer than n seconds represents storage of a combination of positions of external regulation elements to a selected memory location, The value of n is preferably from 2 to 5 seconds.

The device according to the invention can optionally also include:

- An indication element, wherein the element is arranged around or adjacent to each external regulation element and indicates the current position of the digital regulation element; the indication element is connected to the control circuit and preferably consists of at least two LEDs or of a display.
- A display that indicates which memory location is currently selected and is connected to a control circuit; the display may be formed in various ways and may be any known display, for instance a display indicating a consecutive number of a selected memory location, a combination of illuminating elements, e. g. LEDs; preferably a display is a field of LEDs, wherein the number of diodes equals the number of memory locations and a diode that is illuminated on the display indicates which memory location is selected.
- An ON/OFF button of the analogue effect, wherein, while in the ON mode, the input sound signal is processed by an analogue effect, and while in the OFF mode, the sound signal passes through the device in an undisturbed way, such that the output sound signal is rather identical to the input sound signal, preferably as a "true bypass". This ON/OFF button is used especially with those devices according to the invention which are an upgrade of such classic sound processing devices that have an ON/OFF button for the analogue effect.
- A communication circuit with an antenna that is connected with the control circuit and provides for a remote control of the device via external device, for instance by an application on a phone, tablet or computer. In this case, not only a combination of positions of external regulation elements but also a combination of positions that are downloaded from an external device are entered to a selected memory location in the device according to the invention.

The device according to the invention may have various power supply modes: external supply via cable or internal supply via battery or storage battery.

Once the device according to the invention has been connected to power supply, the user manages it by pushing at least one control button and by switching the positions of at least one external regulation element.

In the embodiment, in which the device contains an ON/OFF button of an analogue effect, the user, by pushing the ON/OFF button of the analogue effect, either switches the functioning of the analogue effect on, which means that the output sound signal is an input signal processed by the analogue effect, or switches the functioning of the analogue effect off, wherein it is desired that the output signal is as identical to the input signal as possible, preferably carried out as "true bypass". When the analogue effect is switched on, it processes the input sound signal in compliance with the positions of the digital regulation elements.

A software is loaded onto the control circuit that allows operation of the device, namely:

- The user selects an active memory location, in case of several locations, by at least one control button, or saves the position of the external regulation elements to a selected memory location.
- The external regulation elements allow the user to manually operate the device, namely to manually set the desired sound processing as is made possible by classic analogue sound processing devices such as potentiometers and/or switches.
- If the device according to the invention comprises a communication circuit, the user can also enter a combination of positions downloaded from an external device to a selected memory location in the device according to the invention.

The external regulation elements, the ON/OFF button and the control button are preferably arranged on an upper panel of the device according to the invention. The user may thus more easily change the positions of the external regulation elements, see these positions and push the ON/OFF button or the control button.

If the device according to the invention is an upgrade of a classic analogue guitar effect, the ON/OFF button is preferably arranged in the centre of a lower part of the upper panel and is more elevated than the control button; the user thus has a possibility to freely push the ON/OFF button by a foot. The control button in such embodiment is preferably arranged at the bottom laterally on the upper panel.

The device according to the invention will now be illustrated by way of one possible embodiment as shown in FIG. 1. This embodiment of the device refers to an upgrade of the analogue guitar effect and comprises:

three external regulation elements (2, 2', 2"), of which two are analogue potentiometers (2, 2') and one is a switch with three positions (2"), wherein all external regulation elements are arranged on an upper panel (1) of the device, corresponding digital regulation elements (4, 4', 4"), i. e. two digital potentiometers (4, 4') and one digital switch (4"), one control button (8), an ON/OFF button (14) for the analogue effect, three indication elements (9, 9', 9") realized as groups of indication diodes, wherein two groups of indication diodes (9, 9') are arranged around two analogue potentiometers (2, 2'), and one group of indication diodes (9") is arranged around the switch (2");

a control circuit (6), four memory locations (7, 7', 7", 7'''), a display (11) embodied as a field of four LEDs, an analogue effect (13), a communication circuit (12) with an antenna.

When the device of the illustrated embodiment is turned on, the analogue effect (13) is in the ON mode, which means that the output sound signal (16) is the input sound signal (15) processed by the analogue effect (13). When the device is turned on, the digital regulation elements (4, 4', 4") are defined by positions of that memory location (7) which was selected when the device was turned off. The pre-downloaded software of the control circuit (6) can also be used to determine that, when the device is turned on, the digital regulation elements (4, 4', 4") are set to the first memory location instead to the location that was selected upon switch-off. The diode from the field of four LEDs which corresponds to the active memory location is illuminated on the display (11). In groups of indication diodes (9, 9', 9") those are illuminated, which correspond to the position of the corresponding digital regulation element (4, 4', 4"). The user thus has a possibility to see whether the positions of the external regulation elements (2, 2', 2") differ from the positions of the corresponding digital regulation elements (4, 4', 4"). In other words, the user can deduct from the indication diodes (9, 9', 9"), whether the analogue effect (13) is controlled by the positions from the selected memory location or in compliance with the positions of the external regulation elements (2, 2', 2"). Once the device is turned on, the user has the following options: (a) by using the ON/OFF button (14) he can turn off the analogue effect (13), wherein the device remains connected to power supply; (b) by pushing the control button (8) by pushes shorter than 2 seconds he can select a desired memory location, in which pre-set positions of the digital regulation elements (4, 4', 4") are stored, wherein, when a memory location is selected, it automatically determines the positions of the digital regulation elements (4, 4', 4"); or (c) by changing the positions of the external regulation elements (2, 2', 2"), the user directly influences the positions of the digital regulation elements (4, 4', 4"). The pre-downloaded software on the control circuit (6) is programmed in a way that, immediately when the control circuit (6) detects that the user is changing any of the positions of the external regulation elements (2, 2', 2"), the control circuit (6) starts using these positions to control the digital regulation elements (4, 4',. 4"), on the basis of which the analogue effect (13) functions. In such event, the control circuit (6) actuates the respective LED on the display (11) to blink and the user thus gets information that the analogue effect (13) is currently not functioning in compliance with the selected memory location but in compliance with the manually set positions of the external regulation elements (2, 2, 2"). Here, the groups of indication diodes (9, 9', 9") indicate the position of the external regulation elements (2, 2', 2") which is identical to the positions of the digital regulation elements (4, 4', 4"). When the user is satisfied with the manually set sound effect of the analogue effect (13) and wants to store it to a selected memory location, he does so by pushing the control button (8) for more than 2 seconds. The user may use the device of the illustrated embodiment in any order of the above-indicated steps.

The device according to the invention in the above embodiment is provided with a communication circuit (12) that is connected with the control circuit (6) or is part thereof. The communication circuit (12) allows the user to control the entire device in real time also by an external device by a touch display (not shown in FIG. 1), for instance by a mobile phone, tablet or computer, either by wire or wireless connection. The control button (8) can also be used to connect the device according to the invention to an external device; here, the push for memorizing must be longer than 2 seconds yet shorter than m seconds, for instance 5 seconds, the push for connection between the device according to the invention and an external device must be longer than m seconds, for instance 5 seconds. The wireless connection between the device and an external device may be realized in one of known ways, e. g. blue tooth or Wi-Fi. A user interface of the application on the display of the external device allows display and alteration of settings of individual elements that constitute the device according to the invention. The user interface preferably consists of several display images that allow handling of the device according to the invention. For instance, one screen may display the current appearance of the upper panel (1) of the device including the current positions of the external regulation elements, the groups of indication diodes (9, 9', 9"), the display, the ON/OFF button (14) and the control button (8). The device according to the invention is controlled by changing the positions of the external regulation elements displayed on the user interface, as if it were controlled by changing the positions of the external regulation elements (2, 2', 2"). An external device, or rather an adequate application loaded on the device, can allow a library of possible combinations of positions of the external regulation elements (2, 2', 2") which can be downloaded to selected memory locations in the device according to the invention. An external device may have an identical number of memory locations as the device according to the invention. When an external device is connected with the device, the user interface displays a screen that allows the user to select which combination of positions of the external regulation elements (2, 2', 2") will be stored to a certain memory location in the device; either the already entered combination should be maintained in a certain memory location in the device or a combination entered in an equivalent memory location in the application or the user selects it from a library of combinations.

Through the application on an external device the user may connect with other users via the Internet and this allows a payable or free exchange of files that contain combinations of positions on an adequate device according to the invention, wherein these files are downloadable into a library of combinations or to a memory location in the device.

The invention claimed is:

1. A device for sound processing comprising at least one external regulation element and an analogue effect, comprising:
   at least one digital regulation element,
   a plurality of indication elements for each of the at least one external regulation element, wherein the plurality of indication elements is arranged around or adjacent to each of the at least one external regulation element and indicate a current position of the at least one digital regulation element;
   at least one control button,
   at least one memory location for storing positions of external regulation elements, and
   a control circuit with a pre-downloaded software;
   wherein the at least one external regulation element is connected with a control circuit and a digital regulation element is assigned to each external regulation element;
   wherein the at least one digital regulation element is connected (a) to the control circuit, from which they obtain data as to which position to take, and (b) to an analogue effect and the positions of the at least one digital regulation element directly determines a sound effect of the analogue effect;
   wherein memory locations are connected with the control circuit or are a part of the control circuit;
   wherein the at least one control button is connected with the control circuit;
   wherein the control circuit controls the device in compliance with the pre-downloaded software and in compliance with user's pushes of the at least one control button, namely: (a) the control circuit selects whether a position of the at least one digital regulation element is determined by the at least one external regulation element or with a pre-set position of the at least one regulation element stored in a selected memory location; (b) if there are several memory locations, the control circuit also selects which memory location is active; and (c) positions of the at least one external regulation element is stored to the selected memory location; and
   wherein the at least one control button enables selection and storage among memory locations, with a push of the least one control button shorter than n seconds represents selection of a memory location and the push longer than n seconds represents storage of a combination of positions of a plurality of the at least one external regulation element to the selected memory location.

2. The device for sound processing according to claim 1, wherein the plurality of indication elements is connected to the control circuit and includes at least two LEDs or of a display.

3. The device for sound processing according to claim 1, further comprising:
two or more memory locations and comprising a display that is connected to the control circuit and indicates which memory location is currently selected.

4. The device for sound processing according to claim 1, further comprising:
an ON/OFF button of the analogue effect, wherein in the ON mode the input sound signal is processed by an analogue effect, while in the OFF mode the sound signal freely passes through the device, preferably as "true bypass".

5. The device for sound processing according to claim 1, further comprising:
a communication circuit with an antenna that is connected with the control circuit and provides for a remote control of the device via external device, for instance by an application on a phone, tablet or computer.

6. The device for sound processing according to claim 1, further comprising:
three external regulation elements, of which two are analogue potentiometers and one is a switch with three positions, wherein all the external regulation elements are arranged on an upper panel of the device, corresponding digital regulation elements, defining two digital potentiometers and one digital switch, one control button, an ON/OFF button for the analogue effect, three indication elements embodied as groups of indication diodes, wherein two groups of the indication diodes are arranged around two analogue potentiometers, and one group of the indication diodes is arranged around the switch, a control circuit, four memory locations, a display embodied as a field of four LEDs, an analogue effect and a communication circuit with an antenna.

7. The device for sound processing according to claim 3, wherein the display is a field of LEDs, wherein the number of diodes equals the number of memory locations and a diode illuminated on the display indicates which memory location is selected.

8. The device for sound processing according to claim 1, wherein the selection of the memory location is a shift to a next memory location.

* * * * *